United States Patent [19]

Kishimoto et al.

[11] 4,390,807
[45] Jun. 28, 1983

[54] SURFACE ACOUSTIC WAVE DEVICE

[75] Inventors: Kiyoharu Kishimoto, Yokohama; Katashi Hazama, Zushi; Akitsuna Yuhara, Yokohama, all of Japan

[73] Assignee: Hitachi, Ltd., Tokyo, Japan

[21] Appl. No.: 337,718

[22] Filed: Jan. 7, 1982

Related U.S. Application Data

[63] Continuation of Ser. No. 90,436, Nov. 1, 1979, abandoned.

[30] Foreign Application Priority Data

Nov. 1, 1978 [JP] Japan .................. 53-133699
Nov. 1, 1978 [JP] Japan .................. 53-133700

[51] Int. Cl.³ .................................. H01L 41/08
[52] U.S. Cl. ............................. 310/313 B; 333/154; 333/193
[58] Field of Search ........... 310/313 B, 313 C, 313 D; 333/150, 153, 154, 193, 195

[56] References Cited

U.S. PATENT DOCUMENTS

| | | | |
|---|---|---|---|
| 3,582,540 | 6/1971 | Adler et al. | 310/313 B X |
| 3,596,211 | 2/1971 | Dias | 310/313 B X |
| 3,810,257 | 5/1974 | Jones et al. | 310/313 B X |
| 3,846,723 | 11/1974 | Writer et al. | 333/193 |
| 3,855,548 | 12/1974 | Nanoi et al. | 310/313 B X |
| 3,991,330 | 11/1976 | Isaacs et al. | 310/313 B |
| 4,060,833 | 11/1977 | Onyshkevych | 310/313 C X |
| 4,178,571 | 12/1979 | Mitchell | 333/195 X |
| 4,203,082 | 5/1980 | Tsukamoto et al. | 310/313 B X |

*Primary Examiner*—Mark O. Budd

*Attorney, Agent, or Firm*—Antonelli, Terry & Wands

[57] ABSTRACT

In a preferred embodiment, a surface acoustic wave device comprises a piezoelectric substrate, a first electrode formed on the substrate and acting to convert an electrical signal into a surface acoustic wave, and second and third electrodes formed on the substrate and acting to convert the surface acoustic wave into an electrical signal. The second and third electrodes are disposed at different distances from the first electrode and connected electrically with each other. Electrode fingers of the second electrode are arranged in a relationship of the opposite polarity with respect to those of the third electrode so as to cause peaks in the constant frequency interval multi-peak frequency characteristics of the device acting as a filter to take place at frequencies which are (integer + $\frac{1}{2}$) times the constant frequency interval $\Delta f$. In another preferred embodiment, a plurality of surface acoustic wave device units are formed on a common piezoelectric substrate. Respective units include a set of first, second and third electrodes and operate at different frequency bands which partly overlap. The distance between the first electrode and the second electrode or the third electrode is determined in the respective units such that the delay time due to the propagation of the surface acoustic wave between the input and output electrodes is equal in the respective units and the output voltage of the output electrode is in phase in the respective units, thereby providing accurate peak frequencies over the whole frequency band at which the surface acoustic wave device operates.

18 Claims, 9 Drawing Figures

SURFACE ACOUSTIC WAVE DEVICE

This is a continuation of application Ser. No. 90,436 filed Nov. 1, 1979, now abandoned.

This invention relates to surface acoustic wave devices and more particularly to a surface acoustic wave device having constant-frequency-interval multi-peak frequency characteristics. The device may include a plurality of device units each of input and output electrodes formed on a common piezoelectric substrate wherein the units operate at different frequency bands and adjacent frequency bands partly overlap so that a suitable arrangement of the input and output electrodes is required for obtaining highly accurate multi-peak frequency characteristics.

A surface acoustic wave device generally has a configuration as shown in FIG. 1. More particularly, on a piezoelectric substrate 3 are formed an input electrode (first electrode) 2 which converts an electric signal from a signal source 1 into a surface acoustic wave, an output electrode (second electrode) 4, and another output electrode (third electrode) 5 connected electrically in parallel with the former output electrode 4, the output electrodes 4 and 5 acting to convert the surface acoustic wave propagating along the piezoelectric substrate 3 to an electric signal. The electric signal derived from these output electrodes 4 and 5 is supplied to a load 6.

The center frequency at which the device operates is determined by the pitch between electrode fingers 2c and 2d which are respectively integral with opposing bus bars 2a and 2b of the input electrode 2, the pitch between electrode fingers 4a and 4b of the output electrode 4, and the pitch between electrode fingers 5a and 5b of the output electrode 5, the electrode fingers 4a and 5a being integral with a common bus bar 7a and the electrode fingers 4b and 5b being integral with an opposing common bus bar 7b. In general, the aforementioned pitches are all equal. The device has such a transfer function $H(\omega)$ that a comb-like characteristic having peaks or bottoms spaced by a frequency interval of $\Delta f = V_s/L$, where L is a distance between the output electrodes 4 and 5 and $V_s$ is a velocity of the surface acoustic wave, is superimposed on a characteristic which is determined by a product $F(\omega) \times G(\omega)$ of a frequency response $F(\omega)$ of the input electrode 2 and a frequency response $G(\omega)$ of the output electrodes 4 and 5 of the same configuration.

To detail the comb-like characteristic, because of the distance L between the bus output electrodes, the delay time between the output electrode 5 and the input electrode 2 is larger than the delay time between the output electrode 4 and the input electrode 2 by a difference of $\tau = L/V_s$. Therefore, for a frequency f of a high frequency signal supplied to the input electrode 2 from the signal source 1, a phase difference $\phi$ between the output electrodes 4 and 5 amounts to $2\pi f \tau$. Thus, for a frequency of $f = n/\tau$ with which the phase difference $\phi$ is n times $2\pi$, i.e., $2\pi$ (n: integer) output voltages of the output electrodes 4 and 5 become in phase to produce a resultant high frequency voltage output. Conversely, for a frequency of $f = (n + \frac{1}{2})/\tau$, output voltages of the output electrodes 4 and 5 have the same amplitude but are out of phase so that the resultant output becomes zero. Consequently, the frequency characteristics have a number of peaks spaced by a frequency interval of $\Delta f = 1/\tau$.

Such multi-peak may be utilized for a channel selecting device of a television receiver, for example. Specifically, it can be utilized in a frequency synthesized channel selecting device in which the output of a local oscillator which is scanning its output frequencies is delivered to the surface acoustic wave device (comb-like characteristic filter), the number of peaks which are delivered as the output of the filter during the scanning are counted, and the local oscillator stops its scanning when the counted peaks coincide with a preset frequency.

Where the surface acoustic wave device is desired to operate over a wide frequency band, for example, at UHF band (530–830 MHz), a single surface acoustic wave device has difficulty in covering the band as a whole. Therefore, the band is divided into, for example, two sub-bands i.e., a higher sub-band and a lower sub-band, and two surface acoustic wave device units respectively associated with the two sub-bands are formed on a single substrate with their outputs connected in parallel. FIG. 2 shows a prior art example of this type which comprises one surface acoustic wave device unit consisting of first, second and third electrodes 21, 31 and 41 taking charge of the higher band, UHFHi, and the other surface acoustic wave device unit consisting of first, second and third electrodes 22, 32 and 42 for the lower band, UHFLo. The pitch between electrode fingers of the UHFHi electrodes is smaller than the pitch between electrode fingers of the UHFLo electrodes. The first electrodes (input electrodes) 21 and 22 for the respective sub-bands have common bus bars 81 and 82 of which bus bar 81 is connected to a common UHF input terminal 9 and bus bar 82 is grounded. Similarly, the second electrodes (output electrodes) 31 and 32 and the third electrodes (output electrodes) 41 and 42 for the respective sub-bands have common bus bars 83 and 84 of which bus bar 83 is connected to an output terminal 10 and bus bar 84 is grounded.

In the prior art surface acoustic wave device as shown in FIG. 2, since the distance between the input and output electrodes is optionally determined and different for the higher and lower sub-band device units, the delay time of the surface acoustic wave due to the propagation thereof from the input electrode to the output electrode in one device unit does not coincide with that in the other device unit with a result that undesired multi-peak characteristics are created corresponding to the difference in the delay time. These undesired characteristics are superimposed on the desired constant-frequency-interval comb-like characteristics. In a frequency band portion at which the output level of the one sub-band device unit approximates the output level of the other sub-band device unit at the overlapped frequencies in, that is, the two sub-bands, the aforementioned phenomenon is eminent.

In conjunction with FIG. 2, when taking for example $x_2$ representative of the center to center distance between the input electrode 21 and the output electrode of the higher sub-band unit being 556 μm, $x_1$ representative of a similar distance for the lower sub-band unit being 1365 μm, a piezoelectric substrate of lithium niobate (LiNbO$_3$) being of y-axis cut and z-axis propagation, and the distance between the output electrodes 31 and 41 (32 and 42) being 1740 μm, a multi-peak characteristics of 4.43 MHz frequency interval is then partly superimposed on a multi-peak characteristic of 2 MHz frequency interval which covers 530 to 830 MHz, within a frequency band covering 630 to 680 MHz at which the two sub-band units have substantially equal output levels. As a result, it is impossible to obtain the multi-peak, 2 MHz frequency interval characteristic over the whole frequency band.

The prior art surface acoustic wave device of FIG. 1 manifesting the multi-peak frequency characteristic will be again discussed with reference to FIG. 3. As shown in FIG. 3, the second electrode 4 has electrode fingers 4a to 4d and the third electrode 5 has electrode fingers 5a to 5d. The arrangement of the electrode fingers 4a to 4d is in relationship of the same polarity with respect to the arrangement of the electrode fingers 5a to 5d. In other words, both the arrangements are symmetrical with respect to the propagation of the surface acoustic wave.

This symmetry can mathematically be expressed as, $$V = A\exp(j2\pi ft)\exp\left(-j\frac{2\pi}{\lambda}x_1\right) + A\exp(j2\pi ft)\exp\left(-j\frac{2\pi}{\lambda}x_2\right) \quad (1)$$

where V represents a resultant output of the surface acoustic wave device, f a frequency of the input signal, $x_1$ a distance between the first electrode 2 and the second electrode 4, $x_2$ a distance between the first electrode 2 and the third electrode 5, $\lambda$ a wave length of the surface acoustic wave, and A an amplitude of the surface acoustic wave.

By setting velocity v of the surface acoustic wave such that $\Delta f = v/(x_2 - x_1)$ and neglecting the time terms, equation (1) can be reduced to, $$V = A'\cos\left(\frac{\pi}{\Delta f}\cdot f\right) \quad (2)$$

where A' is a constant.

Consequently, the resultant output has a frequency characteristic having peaks at $f = n\cdot\Delta f$ (n: integer) and $\Delta f$ corresponds to a frequency interval between the peaks.

With this configuration, when taking $\Delta f = 2$ MHz, for example, the peaks take place at even (even number in mega-Hertz unit) frequencies such as 150 MHz, 152 MHz, — but do not at odd frequencies such as 151 MHz, 153 MHz, —. For $\Delta f = 1$ MHz, the peaks can occur at odd frequencies. But the half value of $\Delta f$ approximately doubles the chip size of the device.

An object of this invention is therefore to obtain constant-frequency-interval multi-peak frequency characteristics which frequency interval is different from that of the prior art device, by maintaining the chip size as it is in the prior art device, thereby extending areas in which the surface acoustic device is employed.

Another object of this invention is to eliminate the aforementioned prior art disadvantages and to provide a surface acoustic device in which the peak frequencies can be preset accurately.

The invention will be described with reference to the accompanying drawings, in which.

Figure 1:
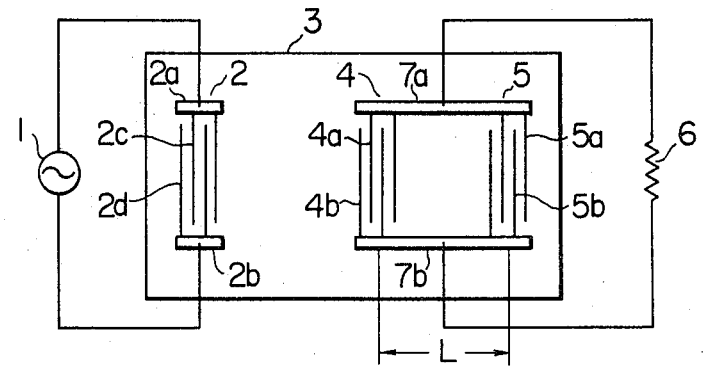
FIG. 1 is a plan view to show the fundamental configuration of a prior art surface acoustic device.
Figure 4:
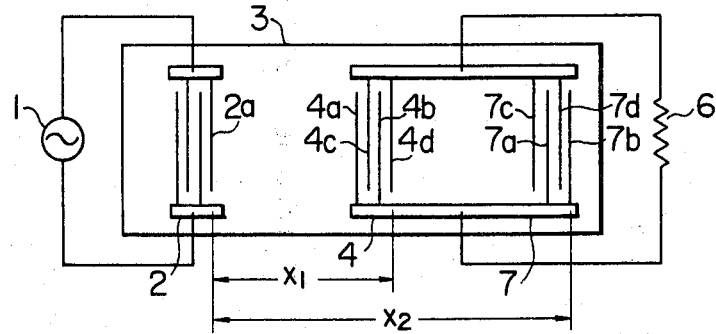
FIG. 4 is a plan view of a first embodiment of a surface acoustic wave device in accordance with the invention.

Referring now to FIG. 4, there is shown a first embodiment of the invention. In FIG. 4, like reference characters designates like elements in FIG. 1. As shown, a second output electrode 4 has electrode fingers 4a to 4d and a third output electrode 7 has electrode fingers 7a to 7d. What is different from FIG. 1 is that the electrode fingers 7a to 7d of the third electrode 7 are in a relationship of opposite polarity with respect to the electrode fingers 4a to 4d of the second electrode 4. The term "opposite polarity" used in this specification will now be explained with reference to FIG. 4. Assuming that the load 6 is substituted by a signal source, the phase of a surface acoustic wave signal produced between the fingers 4a and 4c of the electrode 4 is different by 180° from (opposite to) that of a surface acoustic wave signal produced between the fingers 7a and 7c of the electrode 7 which is connected with the electrode 4 by means of the common bus bar. This is because the fingers 4a and 7a have one polarity (due to one common bus bar connection) and the fingers 4c and 7c have the opposite polarity (due to the other common bus bar connection) while those fingers in the electrodes 4 and 7 which are nearest to the electrode 2 are the fingers 4a and 7c having opposite polarities and those fingers in the electrodes 4 and 7 which are next nearest to the electrode 2 are the fingers 4c and 7a also having opposite polarities. In other words, the arrangement of the electrode fingers 7a to 7d and the arrangement of the electrode fingers 4a to 4d are asymmetrical with respect to the propagation of the surface acoustic wave.

Figure 3:
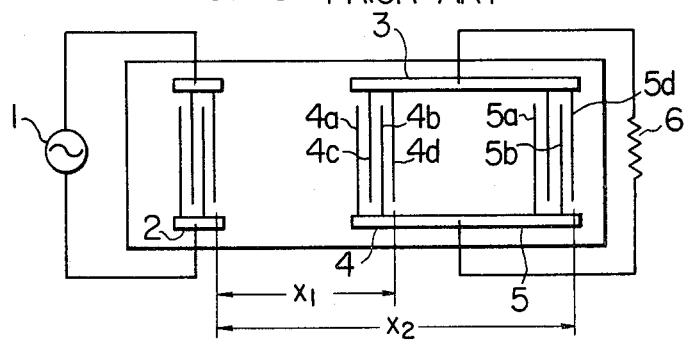
FIG. 3 is a plan view similar to FIG. 1.

In particular, the electrode fingers 7a and 7b of the third electrode 7 are placed toward the wave front of the propagating surface acoustic wave relative to the electrode fingers 7c and 7d, respectively, in contrast to the corresponding electrode fingers 4a and 4b of the second electrode 4, thus ensuring the opposite polarity relationship. The distance between electrode finger 2a of the first electrode (input electrode) and the electrode finger 4d is $x_1$ and the distance between the electrode finger 2a and the electrode finger 7d is $x_2$, as in FIG. 3.

This asymmetry can be expressed as, $$V_1 = B\exp(j2\pi ft)\exp\left(-j\frac{2\pi}{\lambda}x_1\right) - \quad (3)$$

-continued $$B\exp(j2\pi ft)\exp\left(-j\frac{2\pi}{\lambda}x_2\right)$$

where $V_1$ represents a resultant output of the electrodes 4 and 7, f a frequency of the input signal, $\lambda$ a wave length of the surface acoustic wave, and B an amplitude of the surface acoustic wave.

By setting velocity v of the surface acoustic wave such that $\Delta f = v/(x_2-x_1)$ and neglecting the time terms, equation (3) can be reduced to, $$V_1 = B'\sin\left(\frac{\pi}{\Delta f}\cdot f\right) \quad (4)$$

where B' is a constant.

Consequently, the resultant output $V_1$ has a frequency characteristic having peaks at $f_0=(n+\frac{1}{2})\Delta f$, n being integer.

Figure 5:
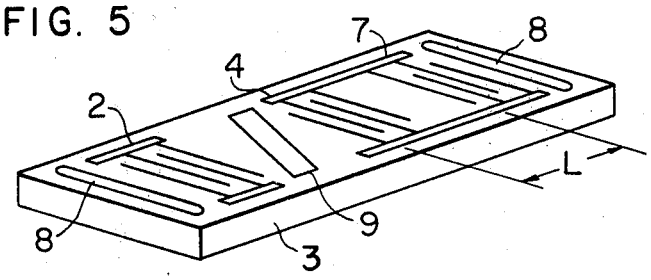
FIG. 5 is a perspective view of a filter incorporating an electrode arrangement in accordance with teachings of FIG. 4 embodiment.

To describe details of the structure embodying the invention, reference is made to FIG. 5 which illustrates a surface acoustic wave device used as a filter having constant-frequency-interval multi-peak frequency characteristic suitable for automatic channel selection of a tuner section of a television receiver. The filter has a second electrode 4 and a third electrode 7, both having the same arrangements of electrode fingers as those shown in FIG. 4, surface acoustic wave absorbers 8 disposed adjacent to a first electrode 2 and the third electrode 7 at opposite ends of a piezoelectric substrate 3, and a shield electrode 9 of metallic thin film interposed between the first electrode 2 and the second electrode 4 to suppress direct waves occuring between the input and output electrodes.

Assuming that the electrodes 2, 4 and 7 are 10-pair unapodized electrodes having center frequencies 113 MHz, the distance L between the output electrodes 4 and 7 is 1741 μm, the filter provides constant-frequency-interval multi-peak frequency characteristics of 2 MHz interval having peaks at a 101MHz, 103 MHz, 105 MHz, —.

In the example of FIG. 5, the second and third electrodes 4 and 7 are disposed on the same side of the first electrode 2. Alternatively, the first electrode may be interposed between the second and third electrodes. It is also possible that the input electrical signal fed to the second and third electrodes 4 and 7 and delivered out of the first electrode 2. Furthermore, the electrodes 4 and 7 may be connected in series.

Figure 2:
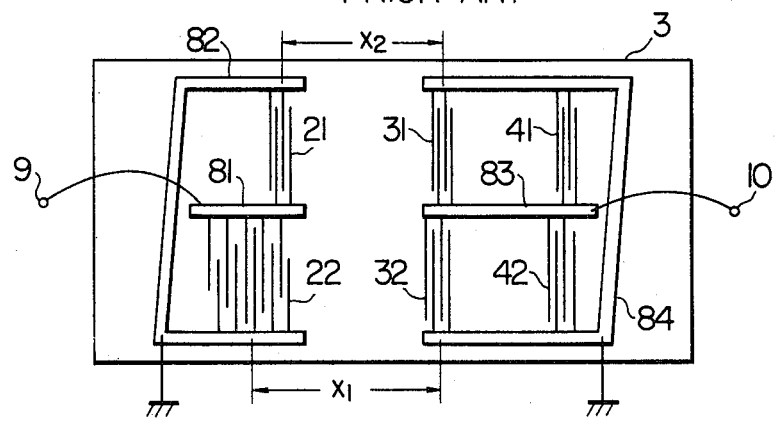
FIG. 2 is a plan view to show a prior art wide band surface acoustic wave device.
Figure 6:
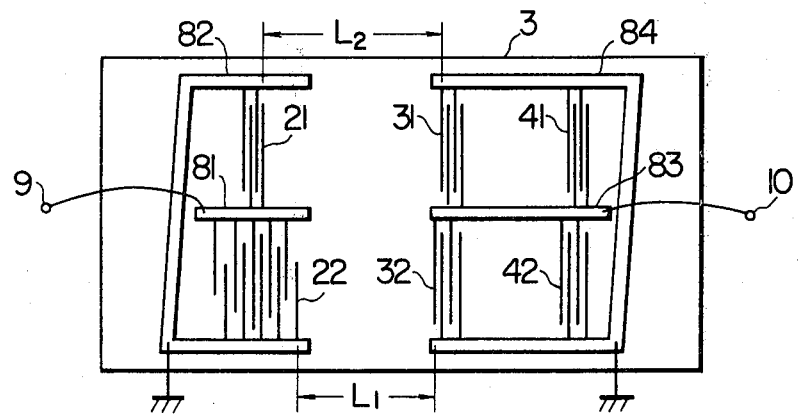
FIG. 6 is a plan view of a second embodiment of a surface acoustic wave device in accordance with the invention.

FIG. 6 shows a second embodiment of the invention wherein, like the prior art of FIG. 2, UHF band (530–830 MHz) is divided into two sub-bands, one surface acoustic wave device unit consisting of a set of an input electrode 21 and output electrodes 31 and 41 taking charge of one sub-band and the other surface acoustic wave device unit consisting of a set of an input electrode 22 and output electrodes 32 and 42 taking charge of the other sub-band are formed on a common substrate 3, and input and output terminals 9 and 10 common to both the sub-bands are provided. For the lower sub-band, the input electrode 22 comprises a 61.5-pair apodized electrode, and the output electrodes 32 and 42 comprise a 7-pair unapodized electrode having a center frequency of 602.5 MHz. For the higher sub-band, the input electrode 21 and output electrodes 31 and 41 each comprise a 5-pair unapodized electrode having a center frequency of 752.0 MHz. The substrate 3 made of LiNbO$_3$ of Y-axis cut and Z-axis propagation is provided with the electrodes of 0.1 μm thick aluminum. The distance between the output electrodes is 1740 μm.

In this embodiment, for distance $L_2$ between the leading electrode finger of the input electrode 21 and the trailing electrode finger of the output electrode 31 and for distance $L_1$ between the leading electrode finger of the input electrode 22 and the trailing electrode finger of the output electrode 32, the difference in distance $(L_2-L_1)$ was set to be 177.4 μm so that the delay time due to the propagation of the surface acoustic wave from the input electrode 21 to the output electrode 31 in the higher sub-band unit is made equal to the delay time due to the propagation of the surface acoustic wave from the input electrode 22 to the output electrode 32 in the lower sub-band unit, and output voltages of the output electrodes 31 and 32 become in phase. As a result, undesired constant-frequency-interval multi-peak characteristics due to the delay time of the surface acoustic wave propagation between the input and output electrodes were eliminated and highly accurate peak frequencies covering 530 to 830 MHz could be obtained.

Figure 7:
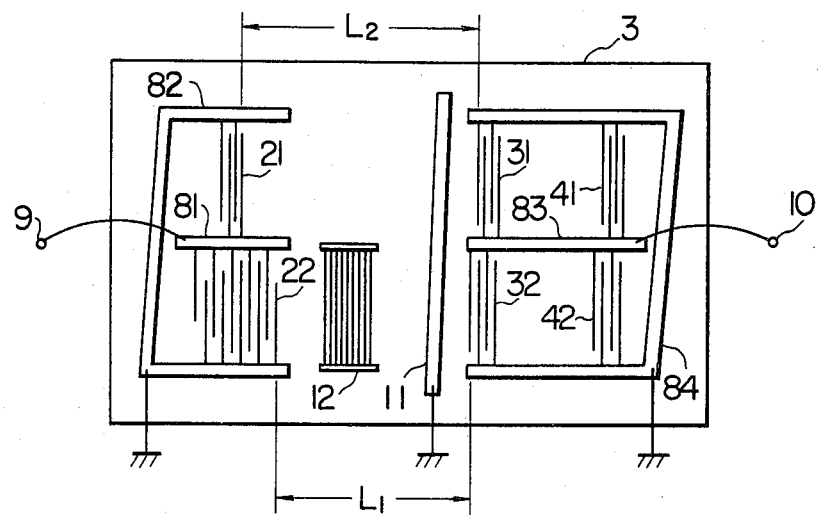
FIG. 7 is a front view of a third embodiment of a surface acoustic wave device in accordance with the invention.

FIG. 7 shows a third embodiment of the invention which has the same electrode arrangement as that of FIG. 6, that is, the same polarity relationship between the electrode fingers of the second electrode and those of the third electrode but additionally comprises a shield electrode 11 interposed between the input and output electrodes and across the two surface acoustic wave units to attenuate the level of direct waves, and a grating reflector 12 (comprised of 200 grating conductors and having a center frequency of 522 MHz) interposed between the input electrode 22 and output electrode 32 of the lower sub-band unit to attenuate the lowermost frequency region of the frequency band.

Figure 8:
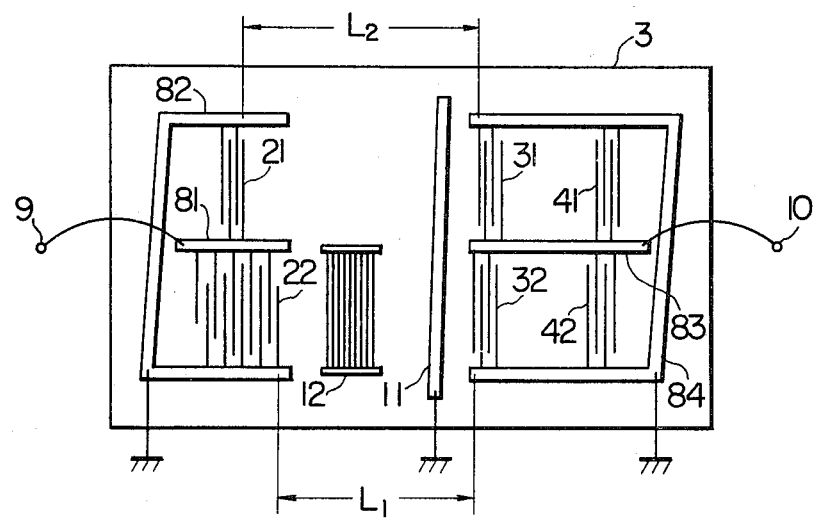
FIG. 8 is a plan view of a fourth embodiment of a surface acoustic wave device in accordance with the invention.

FIG. 8 shows a fourth embodiment of the invention which has substantially the same electrode arrangement as that of FIG. 7 except that the electrode fingers of the second electrode are arranged in the opposite polarity relationship with those of the third electrode. This embodiment additionally comprises a shield electrode 11 and a grating reflector 12 which are identical with those of FIG. 7.

Figure 9:
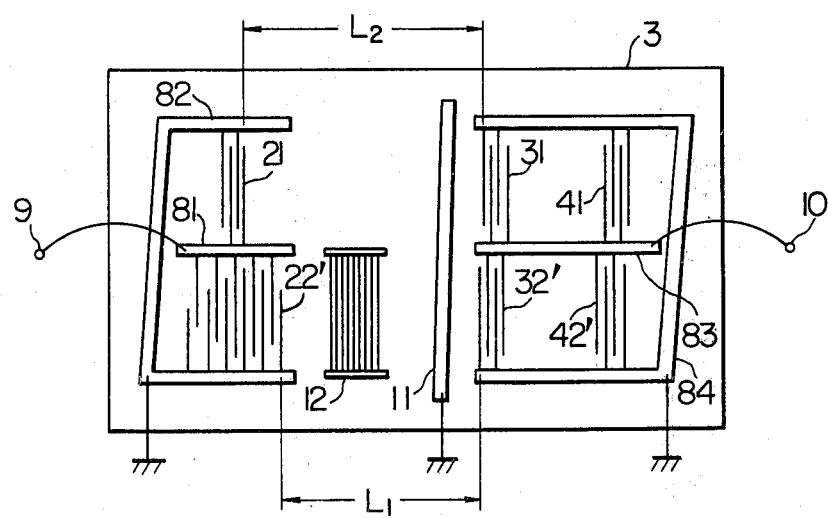
FIG. 9 shows another embodiment of the present invention.

In FIG. 9 showing a fifth embodiment of the present invention, the filter structure is basically identical with that shown in FIG. 8. The differences therebetween only lie in that the electrode 22' has another finger arrangement (e.g., the number of the fingers is different) and the arrangement of the fingers of the electrodes 32' and 42' are such as to deal with a surface acoustic wave signal the polarity of which is opposite to that of the surface acoustic wave signal dealt with by the electrodes 32 and 42 shown in FIG. 8. Since the finger arrangement of the electrode 22' is such as to produce a surface acoustic wave signal which will be received at the electrodes 32' and 42' with a phase or polarity opposite to that of the acoustic wave signal received at the electrodes 32 and 42 in FIG. 8, the modified electrode structures 32' and 42' shown in FIG. 9 is necessary for making the electric signals obtained from electrodes 31, 41, 32' and 42' in phase with each other.

In the foregoing embodiments with reference to FIGS. 6–9, the delay time between the input electrode and the output electrode close thereto in one device unit was made equal to the delay time between the input electrode and the output electrode close thereto in the other device unit and outputs from the close output electrodes in the two device units were rendered in phase. But, as will be clearly seen from the fundamental operational description with reference to FIG. 1, the elimination of difference in the delay time may be effected between the input electrode and the output electrode which is remote therefrom, and the establishment of the in-phase output may be effected in connection with the remote output electrode. The number of surface acoustic wave device units is not limited to two but it may be three or more. The second and third electrodes acting as the output electrode in the foregoing embodiments may alternatively be used as the input electrode. Also, the first electrode may be interposed between the second and third electrodes at different distances therefrom. Further, the electrodes 31 and 34 (32 and 42; 32' and 42') may be connected in series.

As described above, according to the invention, the second and third electrodes connected in parallel (or in series) with their electrode fingers arranged in the opposite polarity relationship ensure that peak frequencies can occur at (integer+$\frac{1}{2}$) times the frequency interval. Accordingly, for a frequency interval of 2 MHz, for example, it is possible to provide a filter having constant-frequency-interval multi-peak characteristic in which the magnitude of peaks is odd in mega-Hertz unit, without increasing the size of chip. Furthermore, according to the invention, since the distance between the input and output electrodes in the sub-band device units formed on a single substrate is determined such that the delay time(s) between the input and output electrodes are equal and the output voltages are in phase in the sub-band device units, accurate multi-peak frequencies covering the whole frequency band at which the sub-band units operate can be ensured, thereby extending areas in which the surface acoustic device is employed.

What we claim is:

1. A surface acoustic wave device having constant-frequency-interval multi-peak frequency characteristics where the frequency interval between adjacent peak frequencies is $\Delta f$, the device comprising:

a piezoelectric substrate;

first, second and third electrodes formed on said substrate in spaced relation to each other, each of said three electrodes having a passband not narrower than said frequency interval $\Delta f$;

signal source means coupled to one of said three electrodes to effect a first conversion with one electrode to convert an electric signal generated by said signal source means into a surface acoustic wave signal which is propagated along said substrate by said one electrode;

means for electrically connecting the other two electrodes to each other in a polarity reversed sense; and detector means coupled to said other two electrodes to effect a second conversion with said other two electrodes to convert the surface acoustic wave signal propagated by said one electrode and received by said other two electrodes into an electric signal through said detector means, wherein said three electrodes are spaced apart from one another on said substrate so that the difference between the distance between said first and second electrodes and the distance between said first and third electrodes is equal to $v/\Delta f$, where v represents the speed of a surface acoustic wave propagating along the surface of said substrate, so that peak frequencies defined by $(n+\frac{1}{2})\Delta f$ ($n = 0, 1, 2, —$) are obtained from said surface acoustic wave device.

2. A surface acoustic wave device comprising:

a piezoelectric substrate;

a plurality of device units formed on said substrate, each including first, second and third electrodes in spaced relation to each other on said substrate;

signal source means coupled to one of said three electrodes in each of said plurality of device units to effect a first conversion with said one electrode to convert an electric signal generated by said signal source means into a surface acoustic wave signal which is propagated along said substrate by said one electrode;

detector means coupled to the other two electrodes in each of said plurality of device units to electrically connect said other two electrodes to each other and to effect a second conversion with said other two electrodes to convert the surface acoustic wave signal propagated by said one electrode and received by said other two electrodes into an electric signal through said detector means, wherein said device units have individual constant-frequency-interval multi-peak frequency characteristics, the frequency bands of which are adjacent to each other with neighboring band portions of two adjacent frequency bands being overlapped with each other, and wherein the three electrodes in each of said device units are spaced apart from one another on said substrate so that each of said device units has one and the same delay time between said one of the three electrodes and at least one of said other two electrodes, and an electric signal at least at one of said other two electrodes in any one of said device units is in phase with that in each of the other device units.

3. A surface acoustic wave device comprising:

a piezoelectric substrate;

a plurality of device units formed on said substrate, each including first, second and third electrodes in spaced relation to each other on said substrate;

signal source means coupled to one of said three electrodes in each of said device units to effect a first conversion with said one electrode to convert an electric signal generated by said signal source means into a surface acoustic wave signal which is propagated along said substrate by said one electrode;

means for electrically connecting the other two electrodes in each of said device units to each other in a polarity reversed sense; and detector means coupled to said other two electrodes in each of said device units to effect a second conversion with said other two electrodes to convert the surface acoustic wave signal propagated by said one electrode and received by said other two electrodes into an electric signal through said detector means, wherein said device units have individual constant-frequency-interval multi-peak frequency characteristics, the frequency bands of which are adjacent to each other with neighboring band portions of two adjacent frequency bands being overlapped with each other, and each of the three electrodes in each of said device units has a passband not narrower than the frequency interval of the associated device unit, and further wherein the three electrodes in each of said device units are spaced apart from one another on said substrate so that each of said device units has one and the same delay time between said one of the three electrodes and at least one of said other two electrodes, and an electric signal at least at one of said two electrodes in any one of said device units is in phase with that in each of the other device units, and that the difference between the distance between said first and second electrodes and the distance between said first and third electrodes is equal to v/Δf, where v represents the speed of a surface acoustic wave propagating along the surface of said substrate in the associated device unit and Δf represents the interval between adjacent two peak frequencies of the associated device unit, so that peak frequencies defined by (n+½)Δf in each of said device units where n=0, 1, 2, —are obtained from said surface acoustic wave device.

4. A surface acoustic wave device according to claim 1, 2, or 3, in which said other two electrodes effecting said second conversion are in parallel connection to each other.

5. A surface acoustic wave device according to claim 4, 5, or 6, in which said other two electrodes effecting said second conversion are in series connection to each other.

6. A surface acoustic wave device having constant-frequency-interval multi-peak frequency characteristics where the frequency interval between adjacent peak frequencies is Δf, the device comprising:
a piezoelectric substrate;
first, second and third electrodes formed on said substrate in spaced relation to each other, each of said three electrodes having a passband not narrower than said frequency interval Δf;
an electric signal source;
means for coupling said first electrode to said electric signal source to convert an electric signal generated by said electric signal source into a surface acoustic wave signal along said substrate;
a detection means;
means for coupling said detection means to said second and third electrodes so that said second and third electrodes are electrically connected to each other in a polarity reversed sense with respect to said detection means, said second and third electrodes receiving the surface acoustic wave signal propagating along said substrate and converting it to an electric signal for propagation through said detection means,
wherein said three electrodes are spaced apart from one another on said substrate so that the difference between the distance between said first and second electrodes and the distance between said first and third electrodes is equal to v/Δf, where v represents the speed of a surface acoustic wave propagating along the surface of said substrate, so that peak frequencies defined by (n+½)Δf (n=0, 1, 2, —) are obtained from said surface acoustic wave device.

7. A surface acoustic wave device according to claim 9, wherein said detection means comprises a resistor for converting said electric signal from said second and third electrodes into a voltage signal.

8. A surface acoustic wave device having constant-frequency-interval multi-peak frequency characteristics where the frequency interval between adjacent peak frequencies is Δf, the device comprising:
a piezoelectric substrate;
first, second and third electrodes formed on said substrate in spaced relation to each other, each of said three electrodes having a passband not narrower than said frequency interval Δf;
means for electrically connecting two of said three electrodes to each other in a polarity reversed sense;
signal source means coupled to said two of said three electrodes to effect a first conversion with said two electrodes to convert an electric signal generated by said signal source means into a surface acoustic wave signal which is propagated along said substrate by said two electrodes; and
detector means coupled to said other electrode to effect a second conversion with said other electrodes to convert the surface acoustic wave signal propagated by said two electrodes and received by said other electrode into an electric signal through said detector means,
wherein said three electrodes are spaced apart from one another on said substrate so that the difference between the distance between said first and second electrodes and the distance between said first and third electrodes is equal to v/Δf, where v represents the speed of a surface acoustic wave propagating along the surface of said substrate, so that peak frequencies defined by (n+½)Δf (n=0, 1, 2,—) are obtained from said surface acoustic wave device.

9. A surface acoustic wave device comprising:
a piezoelectric substrate;
a plurality of device units formed on said substrate, each including first, second and third electrodes in spaced relation to each other on said substrate;
signal source means coupled to two of said three electrodes in each of said plurality of device units to effect a first conversion with said two electrodes to convert an electric signal generated by said signal source means into a surface acoustic wave signal which is propagated along said substrate by said two electrodes; and
detector means coupled to the other electrode in each of said plurality of device units to effect a second conversion with said other electrode to convert the surface acoustic wave signal propagated by said two electrodes and received by said other electrode into an electric signal through said detector means,
wherein said device units have individual constant-frequency-interval multi-peak frequency characteristics, the frequency bands of which are adjacent to each other with neighboring band portions of two adjacent frequency bands being overlapped with each other, and wherein the three electrodes in each of said device units are spaced apart from one another on said substrate so that each of said device units has one and the same delay time between said one of the three electrodes and at least one of said other two electrodes and an electric signal at least at one of said other two electrodes in any one of said device units is in phase with that in each of the other device units.

10. A surface acoustic wave device comprising:

a piezoelectric substrate;

a plurality of device units formed on said substrate, each including first, second and third electrodes in spaced relation to eath other on said substrate;

means for electrically connecting two of said three electrodes in each of said device units to each other in a polarity reversed sense;

signal source means coupled to said two of said three electrodes in each of said device units to effect a first conversion with said two electrodes to convert an electric signal generated by said signal source means into a surface acoustic wave signal which is propagated along said substrate by said two electrodes; and detector means coupled to said other electrode in each of said device units to effect a second conversion with said other electrode to convert the surface acoustic wave signal propagated by said two electrodes and received by said other electrode into an electric signal through said detector means, wherein said device units have individual constant-frequency-interval multi-peak frequency characteristics, the frequency bands of which are adjacent to each other with neighboring band portions of two adjacent frequency bands being overlapped with each other, and each of the three electrodes in each of said device units has a passband not narrower than the frequency interval of the associated device unit, and further wherein the three electrodes in each of said device units are spaced apart from one another on said substrate so that each of said device units has one and the same delay time between said one of the three electrodes and at least one of said other two electrodes, and an electric signal at least at one of said two electrodes in any one of said device units is in phase with that in each of the other device units, and that the difference between the distance between said first and second electrodes and the distance between said first and third electrodes is equal to v/$\Delta$f, where v represents the speed of a surface acoustic wave propagating along the surface of said substrate in the associated device unit and $\Delta$f represents the interval between adjacent two peak frequencies of the associated device unit, so that peak frequencies defined by $(n+\frac{1}{2})\Delta f$ in each of said device units where n=0, 1, 2,—are obtained from said surface acoustic wave device.

11. A surface acoustic wave device having constant-frequency-interval multi-peak frequency characteristics where the frequency interval between adjacent peak frequencies is $\Delta f$, the device comprising:

a piezoelectric substrate;

first, second and third electrodes formed on said substrate in spaced relation to each other, each of said three electrodes having a passband not narrower than said frequency interval $\Delta f$, wherein one of said three electrodes is arranged to convert an electric signal generated by an electric signal source into a surface acoustic wave signal which is propagated along said substrate by said one electrode; and means for electrically connecting the other two electrodes to each other in a polarity reversed sense, wherein said other two electrodes are arranged to convert the surface acoustic wave signal propagated by said one electrode and received by said other two electrodes into an electric signal, wherein said three electrodes are spaced apart from one another on said substrate so that the difference between the distance between said first and second electrodes and the distance between said first and third electrodes is equal to v/$\Delta$f, where v represents the speed of a surface acoustic wave propagating along the surface of said substrate, so that peak frequencies defined by $(n+\frac{1}{2})\Delta f$ (n=0, 1, 2,—) are obtained from said surface acoustic wave device.

12. A surface acoustic wave device comprising:

a piezoelectric substrate; and a plurality of device units formed on said substrate, each including first, second and third electrodes in spaced relation to each other on said substrate, wherein one of said three electrodes in each of said plurality of device units is arranged to convert an electric signal generated by an electric signal source into a surface acoustic wave signal which is propagated along said substrate by said one electrode, and further wherein the other two electrodes in each of said plurality of device units are electrically connected to each other to convert the surface acoustic wave signal propagated by said one electrode and received by said other two electrodes into an electric signal, wherein said device units have individual constant-frequency-interval multi-peak frequency characteristics, the frequency bands of which are adjacent to each other with neighboring band portions of two adjacent frequency bands being overlapped with each other, and wherein the three electrodes in each of said device units are spaced apart from one another on said substrate so that each of said device units has one and the same delay time between said one of the three electrodes and at least one of said other two electrodes, and an electric signal at least at one of said other two electrodes in any one of said device units is in phase with that in each of the other device units.

13. A surface acoustic wave device comprising:

a piezoelectric substrate;

a plurality of device units formed on said substrate, each including first, second and third electrodes in spaced relation to each other on said substrate, wherein one of said three electrodes in each of said device units is arranged to convert an electric signal generated by an electric signal source into a surface acoustic wave signal which is propagated along said substrate by said one electrode; and means for electrically connecting the other two electrodes in each of said device units to each other in a polarity reversed sense, wherein said other two electrodes in each of said device units are arranged to convert the surface acoustic wave signal propagated by said one electrode and received by said other two electrodes into an electric signal, wherein said device units have individual constant-frequency-interval multi-peak frequency characteristics, the frequency bands of which are adjacent to each other with neighboring band portions of two adjacent frequency bands being overlapped with each other, and each of the three electrodes in each of said device units has a passband not narrower than the frequency interval of the associated device unit, and further wherein the three electrodes in each of said device units are spaced apart from one another on said substrate so that each of said device units has one and the same delay time between said one of the three electrodes and at least one of said other two electrodes, and an electric signal at least at one of said two electrodes in any one of said device units is in phase with that in each of the other device units, and that the difference between the distance between said first and second electrodes and the distance between said first and third electrodes is equal to v/Δf, where v represents the speed of a surface acoustic wave propagating along the surface of said substrate in the associated device unit and Δf represents the interval between adjacent two peak frequencies of the associated device unit, so that peak frequencies defined by $(n+\frac{1}{2})\Delta f$ in each said device units where n=0, 1, 2,—are obtained from said surface acoustic wave device.

14. A surface acoustic wave device having constant-frequency-interval multi-peak frequency characteristics where the frequency interval between adjacent frequencies is Δf, the device comprising:
a piezoelectric substrate;
first, second and third electrodes formed on said substrate in spaced relation to each other, each of said three electrodes having a passband not narrower than said frequency interval Δf;
means for electrically connecting two of said three electrodes to each other in a polarity reversed sense, wherein said two of said three electrodes are arranged to convert an electric signal generated by an electric signal source into a surface acoustic wave signal which is propagated along said substrate by said two electrodes, and further wherein said other electrode is arranged to convert the surface acoustic wave signal propagated by said two electrodes and received by said other electrode into an electric signal,
wherein said three electrodes are spaced apart from one another on said substrate so that the difference between the distance between said first and second electrodes and the distance between said first and third electrodes is equal to v/Δf, where v represents the speed of a surface acoustic wave propagating along the surface of said substrate, so that peak frequencies defined by $(n+\frac{1}{2})\Delta f$ (n=0, 1, 2,—) are obtained from said surface acoustic wave device.

15. A surface acoustic wave device comprising:
a piezoelectric substrate;
a plurality of device units formed on said substrate, each including first, second and third electrodes in spaced relation to each other on said substrate, wherein two of said three electrodes in each of said plurality of device units are arranged to convert an electric signal generated by an electric signal source into a surface acoustic wave signal which is propagated along said substrate by said two electrodes, and further wherein the other electrode in each of said plurality of device units is arranged to convert the surface acoustic wave signal propagated by said two electrodes and received by said other electrode into an electric signal,
wherein said device units have individual constant-frequency-interval multi-peak frequency characteristics, the frequency bands of which are adjacent to each other with neighboring band portions of two adjacent frequency bands being overlapped with each other, and wherein the three electrodes in each of said device units are spaced apart from one another on said substrate so that each of said device units has one and the same delay time between said one of the three electrodes and at least one of said other two electrodes and an electric signal at least at one of said other two electrodes in any one of said device units is in phase with that in each of the other device units.

16. A surface acoustic wave device comprising:
a piezoelectric substrate;
a plurality of device units formed on said substrate, each including first, second and third electrodes in spaced relation to each other on said substrate; and
means for electrically connecting two of said three electrodes in each of said device units to each other in a polarity reversed sense, wherein said two of said three electrodes are arranged to convert an electric signal generated by an electric signal source into a surface acoustic wave signal which is propagated along said substrte by said two electrodes, and further wherein said other electrode in each of said device units is arranged to convert the surface acoustic wave signal propagated by said two electrodes and received by said other electrode into an electric signal,
wherein said device units have individual constant-frequency-interval multi-peak frequency characteristics, the frequency bands of which are adjacent to each other with neighboring band portions of two adjacent frequency bands being overlapped with each other, and each of the three electrodes in each of said device units has a passband not narrower than the frequency interval of the associated device unit, and further wherein the three electrodes in each of said device units are spaced apart from one another on said substrate so that each of said device units has one and the same delay time between said one of the three electrodes and at least one of said other two electrodes, and an electric signal at least at one of said two electrodes in any one of said device units is in phase with that in each of the other device units, and that the difference between the distance between said first and second electrodes and the distance between said first and third electrodes is equal to v/Δf, where v represents the speed of a surface acoustic wave propagating along the surface of said substrate in the associated device unit and Δf represents the interval between adjacent two peak frequencies of the associated device unit, so that peak frequencies defined by $(n+\frac{1}{2})\Delta f$ in each of said device units where n=0, 1, 2—are obtained from said surface acoustic wave device.

17. A surface acoustic wave device according to claim 11, 12, 13, 14, 15, 16, 17, 18 or 19, in which said two electrodes are in parallel connection to each other.

18. A surface acoustic wave device according to claim 11, 12, 13, 14, 15, 16, 17, 18 or 19, in which said two electrodes are in series connection to each other.

* * * * *